July 22, 1958 S. SABAROFF 2,844,801

LOW PASS FILTER UNITS FOR HIGH FREQUENCY SIGNAL CIRCUITS

Filed Dec. 30, 1953

INVENTOR.

Samuel Sabaroff

United States Patent Office 2,844,801

Patented July 22, 1958

2,844,801

LOW PASS FILTER UNITS FOR HIGH FREQUENCY SIGNAL CIRCUITS

Samuel Sabaroff, Havertown, Pa., assignor to Barker and Williamson, Inc., a corporation of Pennsylvania Application December 30, 1953, Serial No. 401,294

6 Claims. (Cl. 333—79)

The present invention relates to low-pass filters for high frequency and television signal circuits, and more particularly to multi-stage low-pass filters of the unitary type adapted to be inserted in television and other high frequency circuits by coaxial cable connection therewith.

Conventional low pass filter units of the type referred to, and heretofore known, may comprise a series of inductance elements and by-pass capacitors providing a series of filter sections in a closed shield container, the sections being separated by transverse partitions. Such construction is more costly to manufacture and its inherent desirable electrical characteristics tending to provide efficiency in operation may be provided in other ways, in accordance with the invention.

Accordingly, it is an object of this invention, to provide an improved low pass filter unit of the multi-stage type having an improved casing structure and electrical circuit element arrangement whereby lower cost and improved operating characteristics are attained.

It is also an object of this invention, to provide an improved low pass multi-stage filter for high frequency signal circuits and the like, which provides improved inductor and capacitor configuration wholly supported and connected to a single shield element which at the same time provides a single conductor or ground plane for by-passed signal currents within the unit.

It is also an object of this invention, to provide a low-pass multi-stage high frequency filter in which individual shield elements between the stages may be eliminated and in which wave guide action may be attained to prevent coupling between the input and output ends thereof.

In accordance with the invention, a low pass multi-stage high frequency filter is constructed with an elongated closed shield casing having end terminals and a single web or partition member providing a shield wall extending longitudinally thereof.

In accordance with the invention, also, this multi-stage high frequency filter is constructed with an elongated closed shield casing having end terminals and a single web or partition member providing a shield wall extending longitudinally thereof to divide the interior of the casing into two chambers or wave guide portions and to act as a single conductive element between the ends of the casing and as a support for the circuit elements contained therein. The use of the single shield wall or partition extending longitudinally through the casing or container is a distinct departure from known or standard filter units of this type, which are characterized by a series of spaced transverse shield walls to isolate the several sections or stages.

Further in accordance with the invention, the filter inductors or coils are self-supporting and arranged on opposite sides of the shield wall in staggered relation to provide direct series connections between the inductors. Feed-through capacitor structures mounted on the shield wall act as insulated supports for the inductors, as conductive connectors between the inductors, and as filter capacitors to ground between the coils in the filter network.

With this construction, all high frequency signals above the cut-off frequency are by-passed back to the input end of the filter unit through the one central conductor or shield wall and hence do not couple with the forward sections of the unit. Stray signal feed-through from the input to the output conductors of the filter unit is effectively prevented even without shield barriers between the sections because the wave guide effect of the enclosed elongated spaces or chambers on either side of the single central shield wall, provides high stray signal attenuation between the input and output conductors of the unit.

The novel features that are considered to be characteristic of the invention are set forth with particularity in the appended claims. The invention itself, however, both as to its organization and method of operation, as well as additional objects and advantages thereof will best be understood from the following description when read in connection with the accompanying drawing in which:

Figures 1, 3:
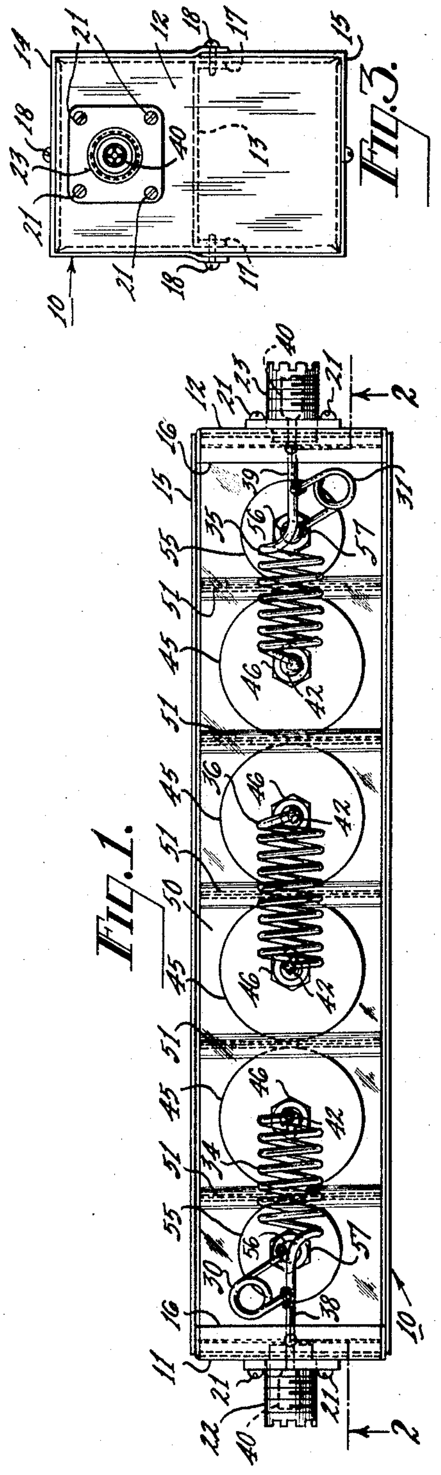
Figure 1 is a top view of a low pass filter unit for high frequency signal circuits and the like embodying the invention, the unit being shown open with the top cover removed.
Figure 3 is an end view of the filter unit shown in Figures 1 and 2.
Figure 2:
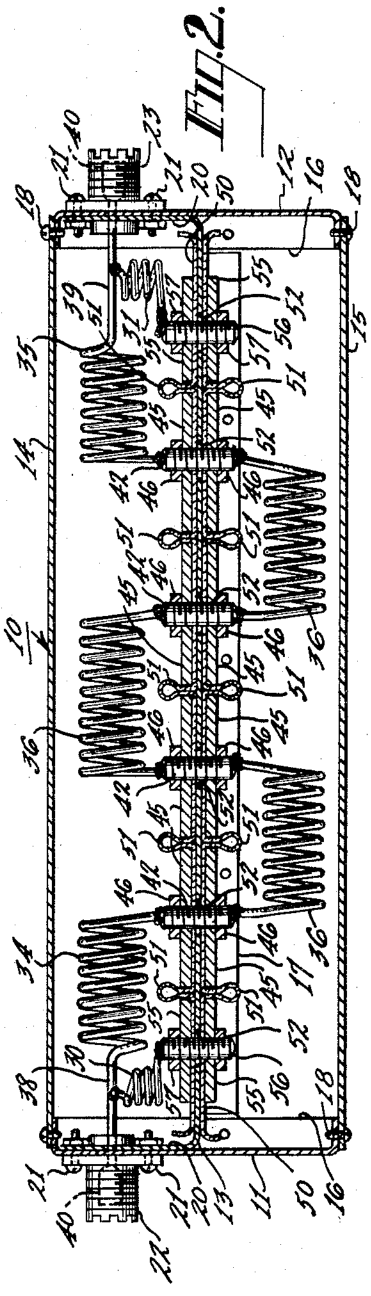
Figure 2 is a side view partly in cross-section of the filter unit shown in Figure 1 and taken on section lines 2—2 of Figure 1, to show further details of its construction in accordance with the invention.

Referring to the drawing, in which like reference characters are used to designate like elements throughout the various figures, and with particular reference to Figures 1, 2 and 3, the low pass filter unit is provided with a rectangular, elongated, closed shield box or casing 10 comprising two conducting parallel end plates 11 and 12 and a single conducting partition member or plate 13 extending longitudinally of the casing as an internal shield wall or ground plane, connected with and between the end plates 11 and 12, as shown more fully in Figure 2. The top, bottom and side walls of the casing are provided by two detachable overlapping cover members 14 and 15 of conducting material, secured to the end plates and along the central partition member. For this purpose the end plates and the partition member are provided with suitable flanges 16 and 17 respectively, to which the cover members are secured by screws 18 or other suitable fastening means permitting the cover members to be readily detachable, while at the same time being secured and electrically united in operation.

As shown more fully in Figure 2, the central partition member 13 is provided with up-turned integral end tabs or bracket elements 20 which are secured to the internal faces of the end plates by suitable means such as through-bolts 21. The latter serve also to mount the flanged and threaded end connectors 22 and 23 for the filter unit. In the present example these connectors are arranged to project into the casing at opposite ends on the same side of the central partition member or plate, whereby they are in the same chamber of the casing, although they may be arranged to project into either chamber depending upon the number of filter sections to be included in the filter unit. In the present example, the filter unit comprises two M-derived end sections and four intermediate constant-K sections having a circuit configuration substantially as shown in Figure 4, to which reference is made along with Figures 1, 2 and 3.

Figure 4:
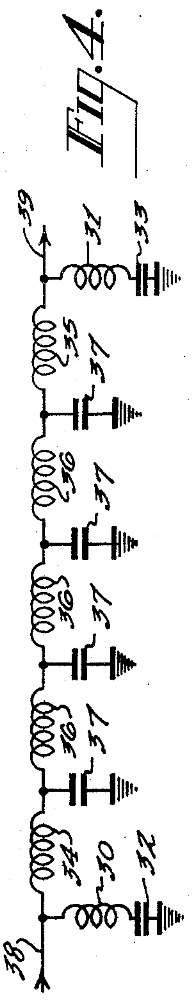
Figure 4 is a schematic circuit diagram showing the circuit configuration of the filter unit of Figures 1, 2 and 3.

In Figure 4, the M-derived end sections comprise inductor elements 30 and 31 and series capacitor elements 32 and 33 operating in conjunction with the series inductors 34 and 35. The four intermediate constant-K sections comprise series inductors 36 and by-pass capacitors 37 arranged in the usual ladder configuration, whereby all of the inductors 34, 35 and 36 provide a through series connection between an input conductor 38 and an output conductor 39, and the capacitors 37 are connected between the junctions of the inductors to ground for the system. In the present example, the filter may be considered to be tuned for cut-off at 42 megacycles (mc.).

The filter unit in accordance with the invention is structurally arranged with the successive filter inductors 34, 35 and 36 arranged in substantially decoupled relation. In the preferred arrangement shown, the inductors are arranged on opposite sides of the central partition member or conductor along the length of the casing, in staggered relation to each other as shown more fully in Figure 2. However, the inductors may all be arranged on the same side of the partition member and staggered to reduce inductive coupling, where size of the unit is important.

The input and output conductors 38 and 39 are connected with insulated central terminals 40 of the end connectors 22 and 23 respectively and with the end inductors 34 and 35 of the filter network as shown more clearly in Figure 2. The adjacent ends of the staggered inductors are connected through the partition member by short conductive, threaded studs 42 to which they are soldered or otherwise secured as shown.

With this arrangement, the series connection of the inductors schematically shown in Figure 4 is provided, in which as in Figure 2, the connections may be traced from the input connector 22 and input conductor 38 through the input inductor 35, the intermediate inductors 36, the output inductor 35 and the output conductor 39, thence to the output connector 23, the intermediate connections between the inductors being made by the connecting studs 42.

It will be noted that each of the studs 42 is surrounded by enlarged flat discs 45 on opposite sides of the partition member 13 and are connected therewith in clamping engagement by suitable clamping nuts 46. It will also be noted that the studs and the discs are insulated from the central partition member by thin sheets 50 of insulating material on opposite sides of the latter and arranged in the present example as continuous sheets which may have loops 51 or the like interposed along their lengths to act as insulating barriers between the adjacent edges of the discs 45. It will be noted that the studs 42 are further electrically insulated from the partition member 13 by the fact that they pass centrally through enlarged clearance openings 52 in the partition member.

The discs 45 being connected with the studs 42 through contact and by the clamping nuts 46, act as capacitor plates with respect to the conducting partition member or shield wall 13, thereby providing feed-through capacitor means mounted in the shield wall at these points. Furthermore, the capacitors comprising the discs or electrodes 45, the insulating or dielectric elements 50 and the shield wall or common electrode means 13, provide insulated support means for the inductors through the medium of the studs 42, and the latter provide conductive connector means for the inductors. The end conductors 38 and 39 are also supported by the end connectors 22 and 23 and thus serve to support the input and output ends respectively of the inductors 34 and 35.

The M-derived filter sections comprising the inductors 30 and 31 and associated inductors 34 and 35 respectively, are connected with the end connections 38 and 39 of the filter network. The capacitors 32 and 33 are provided in a similar manner as the feed-through capacitors for the filter network, in that they comprise conductive discs 55 on opposite sides of the central partition member and the interposed insulating sheets 50 and are provided with clamping means therefore comprising threaded studs 56 which pass through enlarged clearance openings 52 in the partition member, and through the discs 55, with clamping nuts 57 to hold the discs 55 in proper tension. As shown in Figures 1 and 2, the free ends of the inductors 30 and 31 are connected with the studs 56 preferably by soldering as indicated.

It will be noted that the capacity of the various by-pass capacitors may be adjusted to desired values by controlling the pressure applied by the clamping nuts and also by utilizing barrier or insulating sheets of proper thickness and material. In a preferred embodiment the material is of high dielectric constant, known on the commercial market as Teflon, although any suitable plastic or sheet insulating material may be used. In the construction shown, the shield wall 13 is effectively a common electrode means for all of the by-pass or feed-through capacitor means and the dielectric for all of the capacitor means is provided by two sheets of insulating material placed against the top and bottom faces of the wall.

In construction, the end plates 11 and 12, the central shield wall 13 and the detachable cover members 14 and 15 are preferably of heavy gauge sheet copper or other good conductor while the capacitor discs 45 and 55 may be good conducting material such as heavy sheet brass or steel copper plated. The inductors are heavy gauge copper wire which may be coiled as shown and thus be self-supporting, the copper wire being preferably tinned. In any case the inductors are so constructed as to be self-supporting. In certain embodiments of the invention, a greater or lesser number of constant-K sections may be provided in the filter network, and likewise in certain cases the M-derived filter sections may be omitted if desired, for certain applications.

From the foregoing description it will be seen that a low pass filter structure or unit in accordance with the invention is less costly to manufacture and assemble for the reason that all parts are mounted on one shelf which is the central conductive web or partition plate 13. This is connected with and supported between fixed end plates. Thus the structure is entirely open when the cover members are removed and since they are removed above and below the central web, all parts of the conductive circuit are exposed and may readily be placed and connected in assembly without interference. Furthermore because of the central conductor provided in the casing to which all signals above the cut-off frequency are by-passed through the feed-through capacitor means, intercoupling with the forward sections of the filter circuit is minimized. The connection for feedback current flow is mainly through the partition wall 13 to the end plate 11 and the input connector ground element 22.

The filter structure further provides a ground plane shield wall extending longitudinally through the casing, thereby dividing the interior into two wave guide chambers in which the series inductive elements or coils are disposed alternately. As viewed in Figure 2 it will be seen that any stray signal feed-through from the input conductor 38 to the output conductor 39 is prevented without the use of shield barriers between the coils because of the wave guide effect of the enclosed elongated spaces on either side of the barrier 13 which provides high attentuation for such signals at the cut-off frequency and above, which in the present example is 42 megacycles.

It has been found that such a filter effectively attenuates all signal frequencies above the cut-off frequency approximately 75 db or more, throughout the entire television band, with two M-derived M sections and four intermediate sections of the constant K type as shown. Due to its compact construction the filter unit as shown and described in readily adapted for insertion in any co-axial line connection and the insertion loss in any circuit is relatively low.

What is claimed is:

1. A low-pass high frequency filter structure comprising, in combination, an elongated conductive shield casing having end plates connected by a single inductive partition member extending longitudinally thereof and dividing the interior of the casing into two chambers, a plurality of successive series-connected filter inductors arranged along said partition member alternately in the one and the other of said chambers in substantially decoupled relation, shunt filter capacitor means carried by and arranged along the partition member having insulated electrodal elements connected to the junctions of said series-connected inductors, and said partition member providing a common electrodal element and circuit return path for said capacitor means.

2. A low pass filter structure as defined in claim 1, wherein the casing is provided with two complementary detachable cover members secured to the end plates and to the partition member and enclosing the inductors as an effective wave guide means, and wherein end terminal connections for the filter structure are provided on the end plates at the ends of said wave guide means.

3. A low-pass high frequency filter structure compris-in combination, an elongated conductive shield casing having end plates connected by a single partition member extending longitudinally thereof and dividing the interior of the casing into two elongated wave guide portions, a plurality of successive series-connected filter inductors arranged alternately on opposite sides of and along said partition member in staggered relation, and shunt filter capacitor means carried by and arranged along the partition member having insulated electrodal elements connected to the junctions of said series-connected inductors, and said partition member providing a common electrodal element and circuit return path for said capacitor means.

4. A low-pass multi-stage high frequency filter comprising, in combination, an elongated conductive shield casing having end plates and an internal partition member providing a shield wall extending between and connecting said end plates, means including said partition member as a common electrodal element thereof providing a series of shunt connected by-pass capacitors supported by said member, each of said capacitors having an insulated electrode and a conductive connection element therefor extending through said wall, and a plurality of filter inductors arranged in alternate staggered relation on opposite sides of said wall and connected through said last-named elements in series relation.

5. A multi-stage low-pass high frequency filter unit comprising a substantially rectangular elongated shield casing having two conductive end plates and a central conductive partition plate providing a shield wall extending between and connected with said end plates, detachable conductive cover members joined along the plane of said partition providing top, bottom and side walls for said casing, means connecting said cover members to said end plates and said partition plate, means providing a series of filter inductors alternatively disposed on opposite sides of said partition plate within the casing in staggered relation with adjacent ends of said inductors in substantial alignment with each other on opposite sides of said partition plate, shunt capacitor means including said partition plate as one common electrode thereof having elements providing conductive connections between said aligned ends of said conductors and shunt bypass capacitive coupling between said connections and said partition, whereby a series of K-section filters are provided the electrical components of which are mounted on and supported by said partition plate, and means providing input and output connections for said filter series at opposite ends of said casing.

6. A high-frequency low-pass filter structure comprising an elongated closed casing having a single conductive shield partition member extending longitudinally through said casing, series filter inductors comprising self-supporting coils arranged on and along said partition member alternately on opposite sides thereof, means providing insulated series connections through said partition member between said coils, insulated capacitor discs connected with said last-named means on opposite sides of said partition member with the partition member providing a common conductive signal-conveying by-pass connection means and electrodal element therefor, conductive end plates connected with the ends of said partition member, and conductive complementary cover means cooperatively engaging said partition member and end plates to provide therewith a longitudinally divided casing and effective dual wave guide means within said casing between the ends thereof, and terminal connector means for the end inductors of said series at opposite ends of said casing, being thereby separated by said wave guide means.

References Cited in the file of this patent

UNITED STATES PATENTS

| | | |
|---|---|---|
| 1,978,098 | Alexander et al. | Oct. 23, 1934 |
| 2,014,521 | Casper | Sept. 17, 1935 |
| 2,163,775 | Conklin | June 27, 1939 |
| 2,221,105 | Otto | Nov. 12, 1940 |
| 2,346,162 | Hanopol | Apr. 11, 1944 |
| 2,589,076 | Hancock et al. | Mar. 11, 1952 |